United States Patent [19]
Yoo

[11] Patent Number: 5,605,854
[45] Date of Patent: Feb. 25, 1997

[54] INTEGRATED TI-W POLYCIDE FOR DEEP SUBMICRON PROCESSING

[75] Inventor: Chue-san Yoo, Hsin-Chu, Taiwan

[73] Assignee: Taiwan Semiconductor Manufacturing Company Ltd., Hsin-Chu, Taiwan

[21] Appl. No.: 603,116

[22] Filed: Feb. 20, 1996

[51] Int. Cl.⁶ .................................................. H01L 21/441
[52] U.S. Cl. .............................. 437/44; 437/200; 437/247
[58] Field of Search ............................ 437/44, 192, 200, 437/247, 248, 985; 148/DIG. 147

[56] References Cited

U.S. PATENT DOCUMENTS

| | | | |
|---|---|---|---|
| 5,231,038 | 7/1993 | Yamaguchi et al. | 437/44 |
| 5,254,490 | 10/1993 | Kondo | 437/44 |
| 5,352,631 | 10/1994 | Sitaram et al. | 437/200 |
| 5,411,906 | 5/1995 | Johnson et al. | 437/200 |

OTHER PUBLICATIONS

S. Wolf, "Silicon Processing for the VLSI Era–vol. 1" Lattice Press, Sunset Beach, CA. 1986, pp. 397–399.

*Primary Examiner*—Chandra Chaudhari
*Attorney, Agent, or Firm*—George O. Saile; Rosemary L. S. Pike

[57] ABSTRACT

A for forming an integrated titanium and tungsten polycide for deep submicron processing without bridging and having low resistance source/drain and gate materials is described. A gate electrode stack is formed by patterning layers of tungsten silicide overlying polysilicon overlying a gate silicon oxide on the surface of a semiconductor substrate. Lightly doped regions are implanted into the semiconductor substrate using the gate electrode as a mask. Spacers are formed on the sidewalls of the gate electrode. The substrate is annealed in an oxidizing ambient to drive in the lightly doped regions whereby a first silicon dioxide layer is formed overlying the gate electrode and a second silicon dioxide layer is formed overlying the semiconductor substrate wherein the first silicon dioxide layer is thicker than the second silicon dioxide layer. The second silicon dioxide layer is etched away whereby a portion of the first silicon dioxide layer remains. A layer of titanium is deposited over the surface of the substrate. A first RTA is performed to transform a portion of the titanium layer directly overlying the semiconductor substrate into titanium salicide and to transform the remaining titanium layer into titanium nitride. The titanium nitride layer is removed. A second RTA is performed to stabilize the titanium salicide layer. Heavily doped source and drain regions are implanted completing the fabrication of the integrated circuit device.

24 Claims, 4 Drawing Sheets

INTEGRATED TI-W POLYCIDE FOR DEEP SUBMICRON PROCESSING

BACKGROUND OF THE INVENTION (1) Field of the Invention

The invention relates to the fabrication of integrated circuit devices, and more particularly, to a method of achieving a bridging-free salicide and low resistance interconnect process in the fabrication of integrated circuits.

(2) Description of the Prior Art

As the feature sizes shrink in the fabrication of VLSI integrated circuit devices to the deep submicron regime, contact resistance increases and sheet resistivity of the source/drain regions increases. As discussed in *Silicon Processing for the VLSI Era*, Vol. 1, by Stanley Wolf and Richard N. Tauber, Lattice Press, Sunset Beach, Calif., c. 1986, pp.397–399, self-aligned silicide (salicide) technology is used to reduce contact resistance. Titanium salicide is widely used, but has the disadvantage of bridging; that is, the shorting of the gate electrode to the source/drain. This is especially a problem in the deep submicron regime where the sidewall spacer on the gate may be less than about 1000 Angstroms thick.

Wolf and Tauber discuss annealing the titanium in a nitrogen ambient to suppress lateral silicide reaction and thus avoid bridging. U.S. Pat. No. 5,231,038 to Yamaguchi et al also teach annealing in a nitrogen atmosphere.

SUMMARY OF THE INVENTION

A principal object of the present invention is to provide an effective and very manufacturable method of integrating titanium and tungsten polycide for deep submicron processing.

A further object of the invention is to provide a bridging-free titanium salicide process.

Yet another object is to provide a method of forming low resistance source/drain and gate materials.

In accordance with the objects of this invention a method for forming an integrated titanium and tungsten polycide for deep submicron processing without bridging and having low resistance source/drain and gate materials is achieved. A layer of gate silicon oxide is grown over the surface of a semiconductor substrate. A polysilicon layer is deposited overlying the gate silicon oxide layer. A tungsten silicide layer is formed overlying the polysilicon layer. The tungsten silicide, polysilicon and gate silicon oxide layers are patterned to form gate electrodes. First ions are implanted to form lightly doped regions within the semiconductor substrate using the gate electrode as a mask. Spacers are formed on the sidewalls of the gate electrode. The substrate is annealed in an oxidizing ambient to drive in the lightly doped regions whereby a first silicon dioxide layer is formed overlying the gate electrode and a second silicon dioxide layer is formed overlying the semiconductor substrate wherein the first silicon dioxide layer is thicker than the second silicon dioxide layer. The second silicon dioxide layer is etched away whereby a portion of the first silicon dioxide layer remains. A layer of titanium is deposited over the surface of the substrate. A first rapid thermal annealing is performed to transform a portion of the titanium layer directly overlying the semiconductor substrate into titanium salicide and to transform the remaining titanium layer overlying the silicon dioxide and the titanium salicide into titanium nitride. The titanium nitride layer is removed. A second rapid thermal annealing is performed to stabilize the titanium salicide layer. Second ions are implanted to form heavily doped source and drain regions completing the formation of low resistance gate and source and drain material in the fabrication of the integrated circuit device.

Also in accordance with the objects of the present invention, an integrated circuit device having low resistance materials for the gate and source and drain regions is achieved. The integrated circuit device comprises a gate electrode stack on a semiconductor substrate comprising a tungsten silicide layer overlying a polysilicon layer overlying a gate silicon oxide layer, a silicon dioxide layer overlying the gate electrode stack, silicon oxide spacers on the sidewalls of the gate electrode stack, lightly doped regions within the semiconductor substrate underlying the spacers, source and drain regions within the semiconductor substrate not covered by the gate electrode stack and the spacers, a titanium salicide layer overlying the source and drain regions, an insulating layer overlying the gate electrode stack and the titanium salicide layer, and a metal layer contacting the source and drain regions through openings in the insulating layer and the titanium salicide layer to complete electrical connections in the integrated circuit device.

BRIEF DESCRIPTION OF THE DRAWINGS

In the accompanying drawings forming a material part of this description, there is shown.

DESCRIPTION OF THE PREFERRED EMBODIMENTS

FIGS. 1–11 illustrate an N-channel MOSFET integrated circuit device. However, it is well understood by those skilled in the art that a P channel FET integrated circuit device could be formed by simply substituting opposite polarities to those given for the N channel embodiment. Also, in a similar way, a CMOSFET could be formed by making both N channel and P channel devices upon the same substrate.

Figure 1:
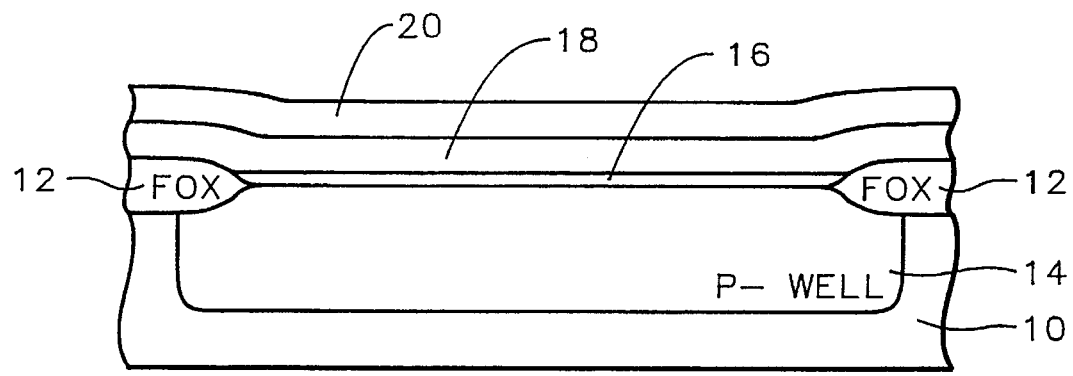
FIGS. 1 through 10 schematically illustrate in cross-sectional representation a preferred embodiment of the present invention.

Referring now more particularly to FIG. 1, there is shown an illustration of a partially completed metal oxide field effect transistor (MOSFET) integrated circuit device. The semiconductor substrate 10 is preferably composed of silicon having a (100) crystallographic orientation. In an effort to simplify the description and the drawings, the dielectric isolation between devices has been only partially shown and will not be described in detail, because they are conventional. For example, Field OXide regions 12 are formed in the semiconductor substrate to separate active areas. Then semiconductor devices can be provided in the silicon mesas according to the following processes.

A P-well 14 is formed as is conventional. The surface of the silicon substrate 10 is thermally oxidized to form the desired gate oxide 16 thickness. The preferred thickness is between about 50 to 200 Angstroms.

Polysilicon layer 18 is deposited by low pressure chemical vapor deposition (LPCVD) to a thickness of between about 1000 to 3000 Angstroms. Then a layer of tungsten silicide 20 is deposited by chemical vapor deposition to a thickness of between about 1000 to 3000 Angstroms. Alternatively, a layer of tungsten is sputter deposited over the polysilicon layer 18 and annealed at a temperature of between about 600° to 900 ° C. to form tungsten silicide layer 20.

Figure 2:
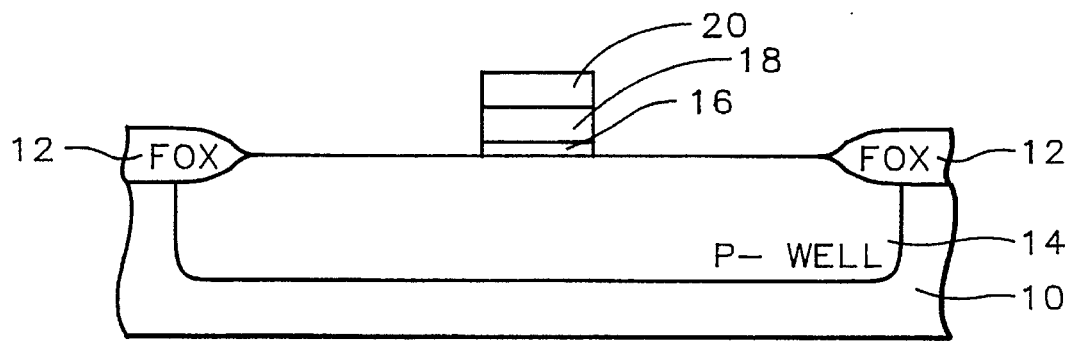

Referring now to FIG. 2, the layers 16, 18 and 20 are etched away where not covered by a photoresist mask to form the polycide gate electrode shown in FIG. 2.

The source/drain structure of the MOS FET may now be formed. FIGS. 1 through 11 show only the N channel MOSFET portion of a CMOS integrated circuit device. It is well understood by those skilled in the art that the P channel portion can be formed by simply substituting opposite polarities to those given for the N channel embodiment. The N well is used for the P channel device. Resist masking is used to prevent unwanted impurities from reaching the device structures being fabricated.

Figure 3:
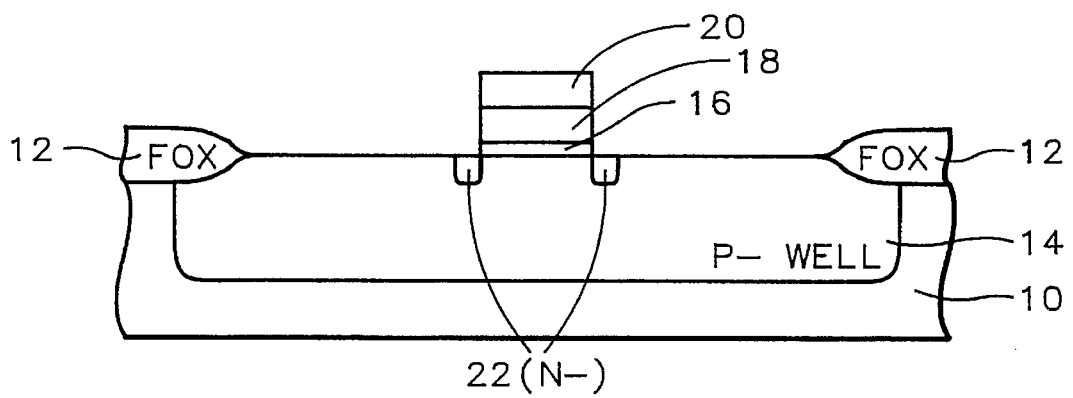

Referring now to FIG. 3, the lightly doped drain (LDD) N- regions are ion implanted. The typical dopant concentration for the regions 22 is P31 at 3 E 13 atoms/cm$^3$.

Figure 4:
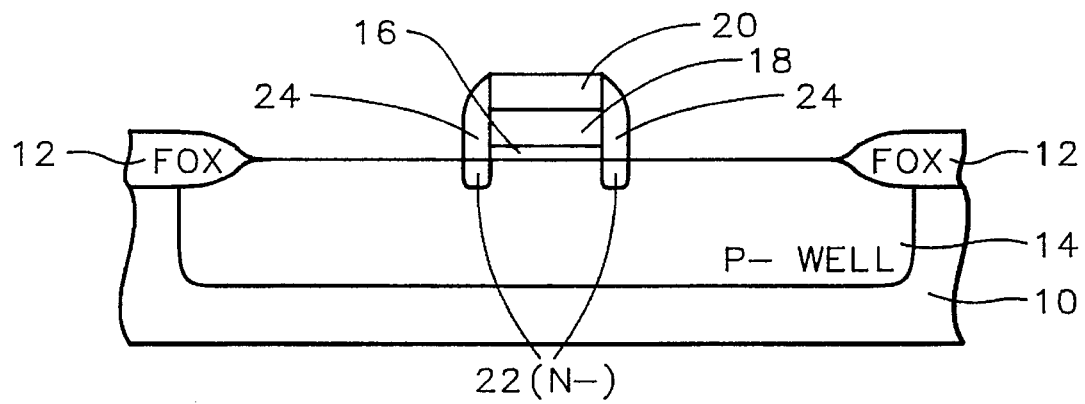

A second layer of silicon dioxide is blanket deposited to a thickness of between about 500 to 3000 Angstroms over the wafer's exposed surfaces. This layer is etched to form spacers 24 on the sidewalls of the gate electrodes, as illustrated in FIG. 4. The spacers 24 have a thickness of between about 500 to 3000 Angstroms.

Figure 5:
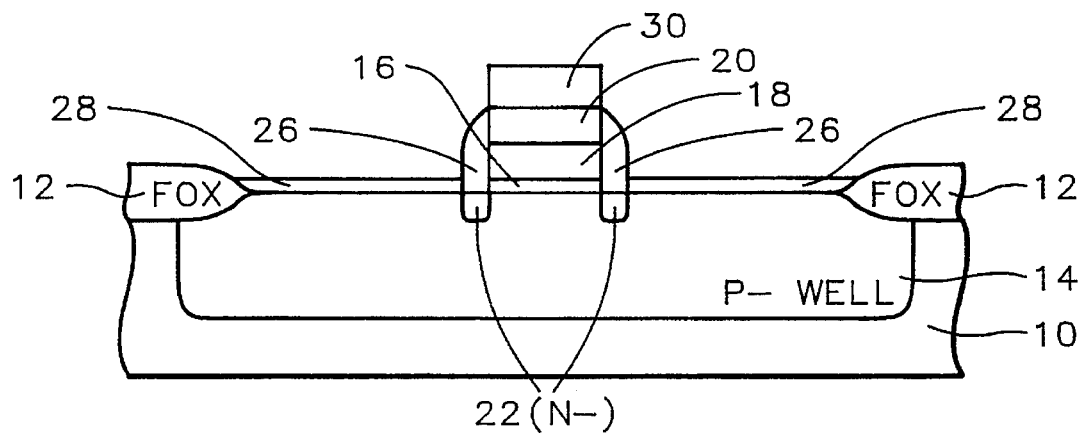

The LDD impurities are driven in by annealing in an oxidizing ambient such as $O_2$ or $H_2O$, for example, at a temperature of between about 900° to 950° C. for between about 25 to 35 minutes. Along with driving in the LDD impurities, this annealing process forms a silicon dioxide layer over the horizontal surfaces of the substrate, as shown in FIG. 5. The silicon dioxide layer is formed to a thickness 28 of between about 60 to 120 Angstroms over the semiconductor substrate and to a thickness 30 of between about 500 to 600 Angstroms over the tungsten silicide layer 20. As discussed in the paper by C. S. Yoo et al, *Japanese Journal of Applied Physics*, vol. 29, No. 11, Nov. 1990, pp. 2535–2540, the oxidation rate of tungsten polycide is higher than that of bare silicon, as can be seen with reference to FIG. 1 of that paper.

Figure 6:
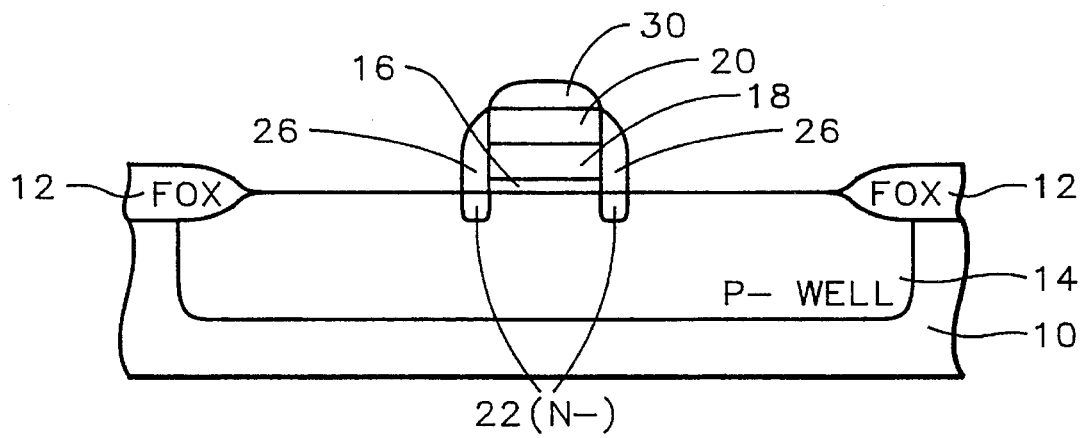

The grown silicon dioxide is then dry etched by approximately 150 Angstroms to leave between about 200 to 300 Angstroms of oxide 30 only over the tungsten silicide, as shown in FIG. 6. The silicon dioxide 30 on the gate will prevent a silicide from forming over the gate, thereby avoiding gate to source/drain shortage during silicide formation.

Figure 7:
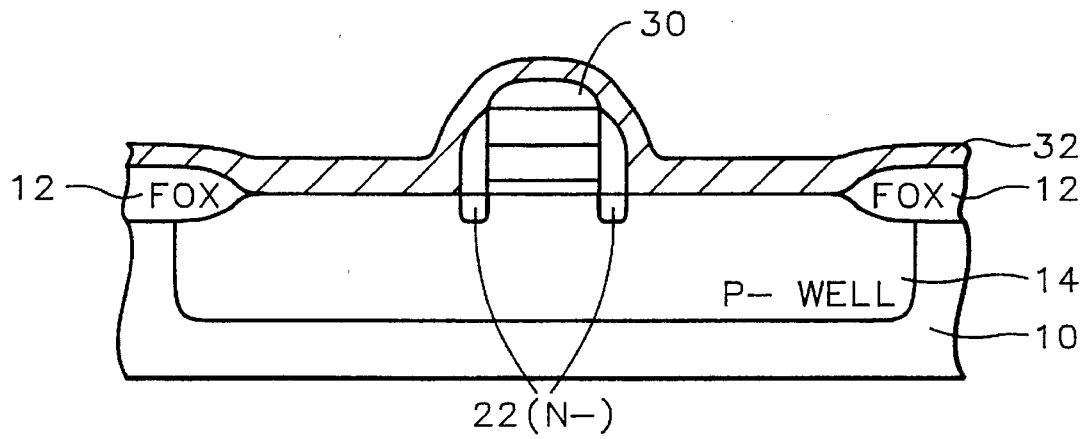

Referring now to FIG. 7, a layer of titanium 32 is deposited over the substrate to a thickness of between about 200 to 1000 Angstroms.

Figure 8:
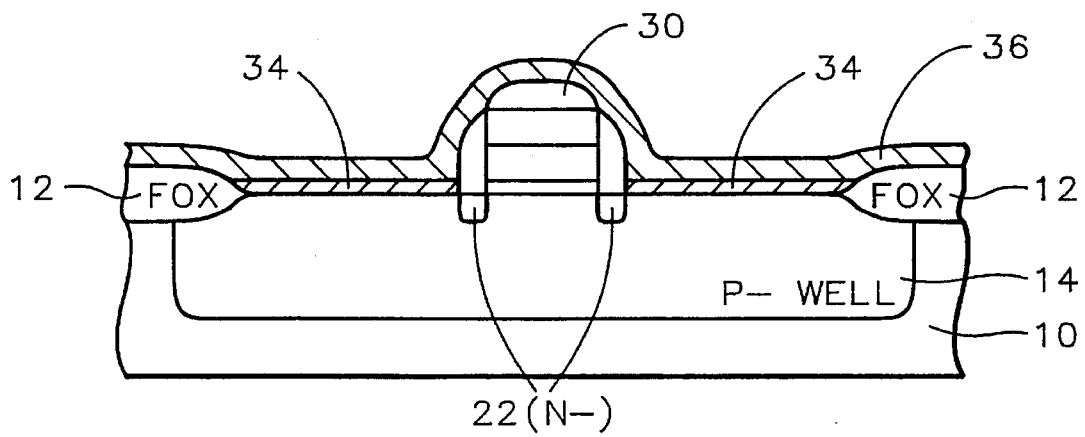

A first rapid thermal annealing (RTA) is performed in a nitrogen ambient, such as $N_2$ or $NH_3$, at a temperature of between about 650° to 750° C. The titanium layer 32 reacts with the underlying silicon to form titanium salicide 34. Titanium nitride layer 36 is formed atop the titanium salicide 34 on the silicon underlayer. The titanium 32 overlying the silicon dioxide 30 and field oxide regions 12 is totally converted to titanium nitride 36, as shown in FIG. 8.

In the conventional process, the gate is not covered with silicon dioxide 30. Hence, the titanium nitride/titanium salicide dual layer is formed on both the gate and source/drain surfaces. Gate to source/drain bridging is very often observed if the first RTA temperature control is not perfect.

However, in the process of the present invention, titanium salicide is not formed on the gate. Therefore, no bridging occurs.

Figure 9:
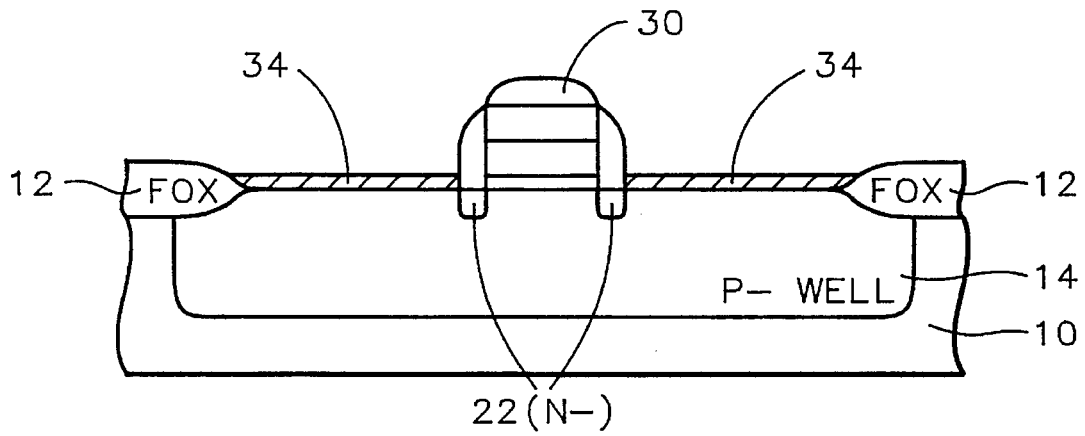

The titanium nitride layer 36 is stripped, leaving the titanium salicide layer 34, as shown in FIG. 9. Next, a second RTA is performed in a nitrogen ambient at a temperature of between about 680° to 730° C. for between about 20 to 50 seconds to stabilize the titanium salicide layer. Titanium salicide layer 34 has a thickness of between about 200 to 600 Angstroms.

Figure 10:
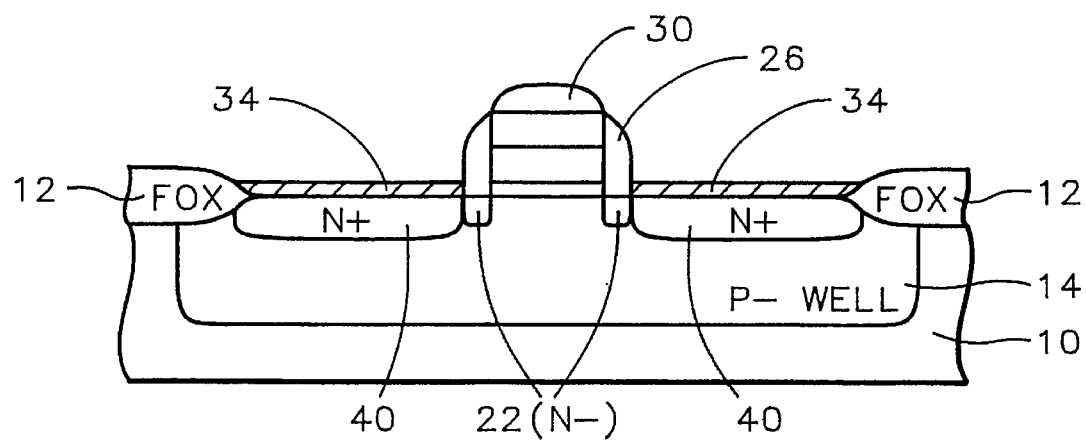

The LDD source/drain regions are completed by the ion implantation of N+ ions, such as phosphorus or arsenic to form the heavily doped regions 40, as shown in FIG. 10. The preferred dopant concentration for these regions 40 is about 2 to 5 E 15 atoms/cm$^3$. Since the dopant is implanted through the salicide layer 34, shallow junctions result.

Figure 11:
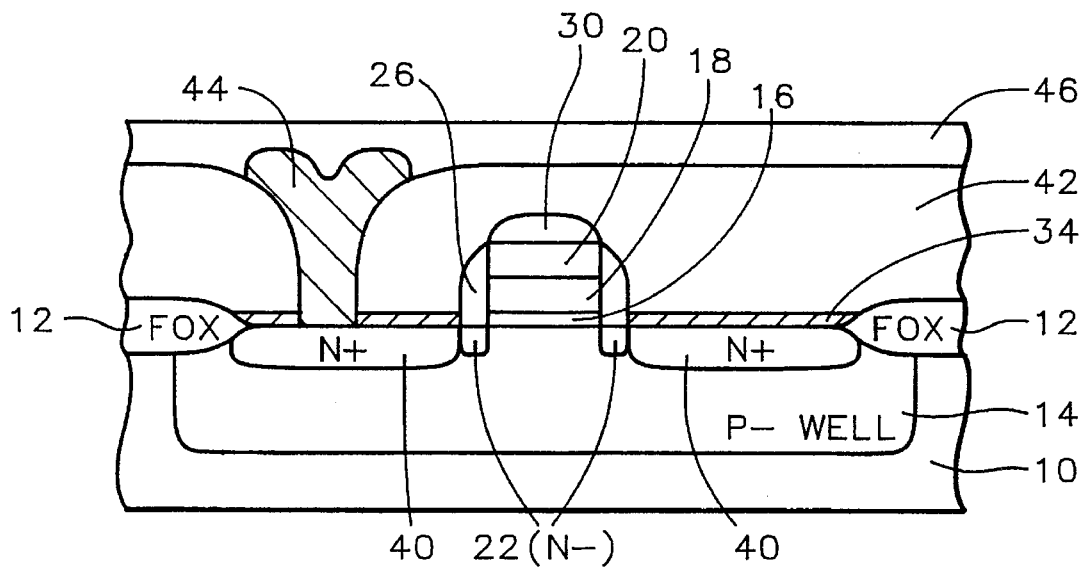
FIG. 11 schematically illustrates in cross-sectional representation a completed integrated circuit device fabricated by the process of the present invention.

This completes the formation of the LDD structure. The integrated circuit device is completed as is conventional in the art. For example, as illustrated in FIG. 11, insulating layer 42 is deposited over the surface of the substrate. Contact openings are made through the insulating layer to the underlying semiconductor devices, such as to a source/drain region 40. A metal layer 44 is deposited and patterned to form electrical connections between the elements of the integrated circuit. A passivation layer 46 completes the fabrication of the integrated circuit device.

The process of the invention provides a bridging-free source/drain salicide, low resistance materials for the gate electrode and for the source/drain, and shallow source/drain junctions.

Referring now to FIG. 11, the integrated circuit device of the present invention having low resistance materials for the gate and source and drain regions will be described. A gate electrode stack on a semiconductor substrate 10 comprises a tungsten silicide layer 20 overlying a polysilicon layer 18 overlying a gate silicon oxide layer 16. A silicon dioxide layer 30 overlies the gate electrode stack and silicon oxide spacers 26 appear on the sidewalls of the gate electrode stack. Lightly doped regions 22 lie within the semiconductor substrate underlying the spacers 26. Source and drain regions 40 lie within the semiconductor substrate not covered by the gate electrode stack and the spacers. A titanium salicide layer 34 overlies the source and drain regions 40. A patterned metal layer 44 contacts one of the source and drain regions 40 through an opening in an insulating layer 42 and the titanium salicide layer 34. A passivation layer 46 completes the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

growing a layer of gate silicon oxide over the surface of a semiconductor substrate;

depositing a polysilicon layer overlying said gate silicon oxide layer;

forming a tungsten silicide layer overlying said polysilicon layer;

patterning said tungsten silicide, said polysilicon and said gate silicon oxide layers to form gate electrodes;

implanting first ions to form lightly doped regions within said semiconductor substrate using said gate electrode as a mask;

forming spacers on the sidewalls of said gate electrode;

annealing said substrate in an oxidizing ambient to drive in said lightly doped regions whereby a first silicon dioxide layer is formed overlying said gate electrode and a second silicon dioxide layer is formed overlying said semiconductor substrate wherein said first silicon dioxide layer is thicker than said second silicon dioxide layer;

etching away said first and second silicon dioxide layers whereby said second silicon dioxide layer is completely removed and a portion of said first silicon dioxide layer remains;

depositing a layer of titanium over the surface of said substrate;

performing a second annealing whereby the portion of said titanium layer directly overlying said semiconductor substrate is transformed into titanium salicide and whereby the remaining said titanium nitride layer overlying said first silicon dioxide layer and overlying said titanium salicide is transformed into titanium nitride;

removing said titanium nitride layer leaving said titanium salicide layer directly overlying said semiconductor substrate; and implanting second ions to form heavily doped source and drain regions completing the fabrication of said integrated circuit device.

2. The method according to claim 1 wherein said polysilicon layer is deposited by low pressure chemical vapor deposition to a thickness of between about 1000 to 3000 Angstroms.

3. The method according to claim 1 wherein said polycide layer has a thickness of between about 1000 to 3000 Angstroms.

4. The method according to claim 1 wherein said spacers have a thickness of between about 500 to 3000 Angstroms.

5. The method according to claim 1 wherein said annealing in an oxidizing ambient is performed in a $O_2$ ambient at between about 850° to 920° C.

6. The method according to claim 1 wherein said annealing in an oxidizing ambient is performed in a $H_2 O)$ ambient at between about 850° to 920° C.

7. The method according to claim 1 wherein said first silicon dioxide layer has a thickness of between about 500 to 600 Angstroms.

8. The method according to claim 1 wherein said second silicon dioxide layer has a thickness of between about 60 to 120 Angstroms.

9. The method according to claim 1 wherein said first silicon dioxide layer remaining after said etching away has a thickness of between about 200 to 300 Angstroms.

10. The method according to claim 1 wherein said second annealing is performed in a $N_2$ ambient at between about 650° to 750° C.

11. The method according to claim 1 wherein said second annealing is performed in a $NH_3$ ambient at between about 650° to 750° C.

12. The method according to claim 1 wherein a third annealing is performed following said removing said titanium nitride layer in a nitrogen ambient at between about 680° to 730° C. for between about 20 to 50 seconds for the purpose of stabilizing said titanium salicide layer.

13. A method of forming low resistance gate and source and drain materials in the fabrication of an integrated circuit device comprising:

growing a layer of gate silicon oxide over the surface of a semiconductor substrate;

depositing a polysilicon layer overlying said gate silicon oxide layer;

forming a tungsten silicide layer overlying said polysilicon layer;

patterning said tungsten silicide, said polysilicon and said gate silicon oxide layers to form gate electrodes;

implanting first ions to form lightly doped regions within said semiconductor substrate using said gate electrode as a mask;

forming spacers on the sidewalls of said gate electrode;

first annealing said substrate in an oxidizing ambient to drive in said lightly doped regions whereby a first silicon dioxide layer is formed overlying said gate electrode and a second silicon dioxide layer is formed overlying said semiconductor substrate wherein said first silicon dioxide layer is thicker than said second silicon dioxide layer;

etching away said first and second silicon dioxide layers whereby said second silicon dioxide layer is completely removed and a portion of said first silicon dioxide layer remains;

depositing a layer of titanium over the surface of said substrate;

performing a second rapid thermal annealing whereby the portion of said titanium layer directly overlying said semiconductor substrate is transformed into titanium salicide and whereby the remaining said titanium nitride layer overlying said first silicon dioxide layer and overlying said titanium salicide is transformed into titanium nitride;

removing said titanium nitride layer leaving said titanium salicide layer directly overlying said semiconductor substrate;

performing a third rapid thermal annealing to stabilize said titanium salicide layer; and implanting second ions to form heavily doped source and drain regions completing the formation of low resistance gate and source and drain material in the fabrication of said integrated circuit device.

14. The method according to claim 13 wherein said polysilicon layer is deposited by low pressure chemical vapor deposition to a thickness of between about 1000 to 3000 Angstroms.

15. The method according to claim 13 wherein said polycide layer has a thickness of between about 1000 to 3000 Angstroms.

16. The method according to claim 13 wherein said spacers have a thickness of between about 500 to 3000 Angstroms.

17. The method according to claim 13 wherein said first annealing in an oxidizing ambient is performed in a $O_2$ ambient at between about 850° to 920° C.

18. The method according to claim 13 wherein said first annealing in an oxidizing ambient is performed in a $H_2O$ ambient at between about 850° to 920° C.

19. The method according to claim 13 wherein said first silicon dioxide layer has a thickness of between about 500 to 600 Angstroms.

20. The method according to claim 13 wherein said second silicon dioxide layer has a thickness of between about 60 to 120 Angstroms.

21. The method according to claim 13 wherein said first silicon dioxide layer remaining after said etching away has a thickness of between about 200 to 300 Angstroms.

22. The method according to claim 13 wherein said second annealing is performed in a $N_2$ ambient at between about 650° to 750° C.

23. The method according to claim 13 wherein said second rapid thermal annealing is performed in a $NH_3$ ambient at between about 650° to 750° C.

24. The method according to claim 13 wherein said third rapid thermal annealing is performed in a nitrogen ambient at between about 680° to 730° C. for between about 20 to 50 seconds.

* * * * *